United States Patent
Oda et al.

(10) Patent No.: US 9,421,741 B2
(45) Date of Patent: Aug. 23, 2016

(54) CHASSIS AND METHOD FOR MANUFACTURING CHASSIS

(71) Applicants: NEOMAX MATERIALS Co., Ltd., Suita-shi, Osaka (JP); HITACHI METALS, LTD., Tokyo (JP)

(72) Inventors: Yoshimitsu Oda, Suita (JP); Keita Watanabe, Suita (JP); Masaaki Ishio, Tokyo (JP)

(73) Assignees: NEOMAX MATERIALS CO., LTD., Suita-shi (JP); HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/413,302

(22) PCT Filed: Jul. 1, 2013

(86) PCT No.: PCT/JP2013/068031
§ 371 (c)(1),
(2) Date: Jan. 7, 2015

(87) PCT Pub. No.: WO2014/010455
PCT Pub. Date: Jan. 16, 2014

(65) Prior Publication Data
US 2015/0190985 A1 Jul. 9, 2015

(30) Foreign Application Priority Data
Jul. 10, 2012 (JP) ................................ 2012-154627

(51) Int. Cl.
*C22C 38/16* (2006.01)
*C22C 38/18* (2006.01)
(Continued)

(52) U.S. Cl.
CPC ............. *B32B 15/015* (2013.01); *B23K 20/02* (2013.01); *B23K 20/04* (2013.01); *B23K 20/227* (2013.01);
(Continued)

(58) Field of Classification Search
CPC ..... C22C 38/18; C22C 38/16; B32B 15/015; B32B 15/04; B32B 15/043; B32B 15/18; B32B 15/20; Y10T 428/12722; Y10T 428/1291; Y10T 428/12917; Y10T 428/12924; Y10T 428/12903; Y10T 428/12958; Y10T 428/12979; Y10T 428/2495
See application file for complete search history.

(56) References Cited

U.S. PATENT DOCUMENTS 5,547,758 A   8/1996   Watanabe et al.
5,576,362 A   11/1996  Watanabe et al.
(Continued)

FOREIGN PATENT DOCUMENTS

CN   101091423 A   12/2007
CN   101497250 A   8/2009
(Continued)

OTHER PUBLICATIONS

International Search Report dated Aug. 27, 2013, issued in corresponding application No. PCT/JP2013/068031.
(Continued)

*Primary Examiner* — Michael E La Villa
(74) *Attorney, Agent, or Firm* — Westerman, Hattori, Daniels & Adrian, LLP

(57) ABSTRACT

This chassis (2) is made of a clad material in which a first layer (21) made of austenite stainless steel, a second layer (22) made of Cu or a Cu alloy, stacked on the first layer, and a third layer (23) made of austenite stainless steel, stacked on the side of the second layer opposite to the first layer are roll-bonded to each other, and the thickness of the second layer is at least 15% of the thickness of the clad material.

19 Claims, 7 Drawing Sheets

(51) Int. Cl.
| | |
|---|---|
| *C21D 9/00* | (2006.01) |
| *C21D 1/26* | (2006.01) |
| *B32B 15/01* | (2006.01) |
| *B23K 20/227* | (2006.01) |
| *B23K 20/02* | (2006.01) |
| *B23K 20/04* | (2006.01) |
| *H05K 5/02* | (2006.01) |
| *B32B 15/04* | (2006.01) |
| *B32B 15/18* | (2006.01) |
| *B32B 15/20* | (2006.01) |
| *H01L 23/373* | (2006.01) |

(52) U.S. Cl.
CPC .............. *B32B 15/04* (2013.01); *B32B 15/043* (2013.01); *B32B 15/18* (2013.01); *B32B 15/20* (2013.01); *C22C 38/16* (2013.01); *C22C 38/18* (2013.01); *H01L 23/3735* (2013.01); *H01L 23/3736* (2013.01); *H05K 5/0213* (2013.01); *B23K 2203/22* (2013.01); *C21D 1/26* (2013.01); *C21D 9/0068* (2013.01); *C21D 2211/001* (2013.01); *C21D 2251/00* (2013.01); *C21D 2251/02* (2013.01); *H01L 2924/0002* (2013.01); *Y10T 428/1291* (2015.01); *Y10T 428/12722* (2015.01); *Y10T 428/12903* (2015.01); *Y10T 428/12917* (2015.01); *Y10T 428/12924* (2015.01); *Y10T 428/12958* (2015.01); *Y10T 428/12979* (2015.01); *Y10T 428/2495* (2015.01)

(56) References Cited

U.S. PATENT DOCUMENTS

| | | | | |
|---|---|---|---|---|
| 5,588,197 | A | * | 12/1996 | Satomi ................ A47J 41/028 29/422 |
| 6,109,504 | A | * | 8/2000 | Groll .................... A47J 37/067 228/107 |
| 6,994,917 | B2 | | 2/2006 | Kinoshita et al. |
| 7,161,809 | B2 | | 1/2007 | Ford et al. |
| 7,570,314 | B2 | | 8/2009 | Lee |
| 2009/0197116 | A1 | | 8/2009 | Cheng et al. |
| 2011/0123826 | A1 | * | 5/2011 | Groll ...................... A47J 36/02 428/652 |

FOREIGN PATENT DOCUMENTS

| | | | |
|---|---|---|---|
| JP | 06-188530 | A | 7/1994 |
| JP | 2003-115564 | A | 4/2003 |
| JP | 2003-133596 | A | 5/2003 |
| JP | 2003-283150 | A | 10/2003 |
| JP | 2004-153075 | A | 5/2004 |
| JP | 2004-241765 | A | 8/2004 |
| JP | 2005-101073 | A | 4/2005 |
| JP | 2006-054297 | A | 2/2006 |
| JP | 2006-113589 | A | 4/2006 |
| JP | 2007-012928 | A | 1/2007 |
| JP | 2007-113864 | A | 5/2007 |
| JP | 2007-129027 | A | 5/2007 |
| JP | 2012-007090 | A | 1/2012 |
| TW | 200938055 | A | 9/2009 |
| WO | WO 2008014233 | * | 1/2008 |

OTHER PUBLICATIONS

Written Opinion dated Aug. 27, 2013, issued in corresponding application No. PCT/JP2013/068031.

CN Office Action dated Oct. 11, 2014, issued in corresponding application No. 201380003400.1 (National phase of PCT/JP2013/068031), w/English translation (19 pages).

Office Action dated Dec. 15, 2015, issued in counterpart Chinese Application No. 201380003400.1. with English translation. (14 pages).

Office Action dated Mar. 3, 2016, issued in counterpart Taiwanese Patent Application No. 102124679, with English translation. (20 pages).

* cited by examiner

FIG.7

EXAMPLES 1 TO 8 (SUS 304/Cu/SUS 304)

| | TOTAL THICKNESS (mm) | Cu THICKNESS RATIO (%) | MAXIMUM TEMPERATURE (°C) | TEMPERATURE DIFFERENCE (°C) | 0.2% PROOF STRENGTH (MPa) |
|---|---|---|---|---|---|
| COMPARATIVE EXAMPLE 1 (SUS 304) | 0.3 | 0.0 | 76.7 | — | 836 |
| COMPARATIVE EXAMPLE 2 | 0.3 | 14.0 | 57.3 | 19.4 | 812 |
| EXAMPLE 1 | 0.3 | 15.0 | 55.4 | 21.3 | 809 |
| EXAMPLE 2 | 0.3 | 20.0 | 49.9 | 26.8 | 793 |
| EXAMPLE 3 | 0.3 | 30.0 | 45.8 | 30.9 | 602 |
| EXAMPLE 4 | 0.3 | 34.0 | 44.1 | 32.6 | 583 |
| EXAMPLE 5 | 0.3 | 42.8 | 43.4 | 33.3 | 512 |
| EXAMPLE 6 | 0.3 | 50.0 | 42.2 | 34.5 | 496 |
| EXAMPLE 7 | 0.3 | 55.6 | 42.5 | 34.2 | 437 |
| EXAMPLE 8 | 0.3 | 60.0 | 41.4 | 35.3 | 395 |
| COMPARATIVE EXAMPLE 3 (Cu) | 0.3 | 100.0 | 38.5 | 38.2 | 210 |
| COMPARATIVE EXAMPLE 4 (GRAPHITE SHEET) | 0.3 | 10.0 (SHEET THICKNESS/ SUS 304 THICKNESS) | 55.0 | 21.7 | 836 |
| COMPARATIVE EXAMPLE 5 (SUS 304) | 0.4 | 0.0 | 56.1 | 20.6 | 836 |
| COMPARATIVE EXAMPLE 6 (Cu FOIL/ SUS 304) | 0.4 | 7.5 (Cu FOIL THICKNESS/ SUS 304 THICKNESS) | 47.9 | 28.8 | 836 |

| | TOTAL THICK-NESS (mm) | Cu THICKNESS RATIO (%) | MAXIMUM TEMPERA-TURE (°C) | TEMPERA-TURE DIFFERENCE (°C) | 0.2% PROOF STRENGTH (MPa) |
|---|---|---|---|---|---|
| COMPARATIVE EXAMPLE 1 (SUS 304) | 0.3 | 0.0 | 76.7 | — | 836 |
| EXAMPLE 9 | | 34.0 | 43.6 | 33.1 | 649 |
| EXAMPLE 10 | | 42.8 | 42.8 | 33.9 | 576 |
| EXAMPLE 11 | | 50.0 | 42.7 | 34.0 | 509 |
| EXAMPLE 12 | | 55.6 | 41.4 | 35.3 | 470 |
| EXAMPLE 13 | | 60.0 | 41.5 | 35.2 | 434 |
| COMPARATIVE EXAMPLE 3 (Cu) | | 100.0 | 38.5 | 38.2 | 210 |

CHASSIS AND METHOD FOR MANUFACTURING CHASSIS

TECHNICAL FIELD

The present invention relates to a chassis suitable for use in a portable device intrinsically containing an electronic component radiating heat, for example and a method for manufacturing the chassis, and more particularly, it relates to a chassis employing stainless steel and Cu and a method for manufacturing the chassis.

BACKGROUND ART

In general, a chassis made of stainless steel having high mechanical strength is employed in a portable device or the like in order to protect a display portion for displaying an image from an external shock. In Japanese Patent Laying-Open No. 2006-113589, for example, there is disclosed a display device including a panel unit and a chassis for fixing and supporting the panel unit. Although not clearly described in Japanese Patent Laying-Open No. 2006-113589, the chassis of the display device is conceivably made of stainless steel having a thickness of about 0.3 mm to about 0.4 mm, which is the thickness of a typical chassis.

In recent years, on the other hand, both high performance and downsizing (thinning) are desired in the portable device. In the case where the performance of the portable device is improved, an increase in the processing speed of an integrated circuit (IC) such as a CPU (Central Processing Unit) and a corresponding increase in power consumption result in an increase in the amount of heat generation in an electronic component of the portable device. Thus, the chassis of the portable device is required to serve as a heat radiation member in order to downsize the portable device while sufficiently ensuring heat radiation performance.

Furthermore, in Japanese Patent Laying-Open No. 2012-7090, for example, it is disclosed that a heat-conductive pressure-sensitive adhesive sheet whose heat conductivity is improved by containing alumina is provided between an electronic component and a chassis in order to improve heat conductivity between the electronic component and the chassis.

In the chassis made of stainless steel described in Japanese Patent Laying-Open No. 2006-113589, however, the heat conductivity of the stainless steel is relatively low, and hence there has been such an inconvenience that the heat radiation performance of the chassis is insufficient even in the case where the heat-conductive pressure-sensitive adhesive sheet described in Japanese Patent Laying-Open No. 2012-7090 is employed.

The heat radiation performance of the chassis made of stainless steel described in Japanese Patent Laying-Open No. 2006-113589 can be improved by bonding a graphite sheet described in Japanese Patent Laying-Open No. 2010-215441, for example, Cu foil less expensive than the graphite sheet, or the like onto the chassis. However, there has been such an inconvenience that the number of components is increased by adding the graphite sheet or the like and the thickness of the portable device is increased, and the improvement of the heat radiation performance of the chassis has been desired.

Therefore, as a structure for improving the heat radiation performance of the chassis, a heat radiation substrate (chassis) employing stainless steel having high mechanical strength and a Cu alloy having high heat conductivity has been proposed in Japanese Patent Laying-Open No. 2007-12928, for example.

In Japanese Patent Laying-Open No. 2007-12928, there is disclosed a heat radiation substrate 602 including a rectangular fitting component 622 made of a Cu—Mo composite material and a base material 621 made of SUS 304, formed with a rectangular hole 621a into which the fitting component 622 is pressed, as shown in FIG. 14. The fitting component 622 of this heat radiation substrate 602 is formed such that the upper surface 622a thereof is smaller than the lower surface 622b thereof and is formed with steps 622c on the outer surface. The hole 621a of the base material 621 into which the fitting component 622 is pressed is formed to correspond to the shape of the fitting component 622 and is formed with steps 621b on the inner surface of the hole 621a. The fitting component 622 is inserted into the hole 621a of the base material 621 from below (Z2 side) to fit together, whereby the fitting component 622 and the base material 621 are joined to each other.

PRIOR ART DOCUMENT

Patent Document

Patent Document 1: Japanese Patent Laying-Open No. 2006-113589
Patent Document 2: Japanese Patent Laying-Open No. 2012-7090
Patent Document 3: Japanese Patent Laying-Open No. 2010-215441
Patent Document 4: Japanese Patent Laying-Open No. 2007-12928

SUMMARY OF THE INVENTION

Problems to be Solved by the Invention

However, in the heat radiation substrate 602 (chassis) disclosed in Japanese Patent Laying-Open No. 2007-12928, the fitting component 622 made of the Cu—Mo composite material having high heat conductivity and the base material 621 made of SUS 304 having high mechanical strength are employed, but the thicknesses of both the fitting component 622 and the base material 621 are required to be ensured to some extent in order to form the steps 622c and 621b on the fitting component 622 and the base material 621, respectively. Thus, the thickness of the chassis is increased, and hence there is such a problem that it is difficult to reduce the thickness of the portable device or the like employing the chassis. In addition, the fitting component 622 inserted into the hole 621a of the base material 621 may come off when external force is applied to the chassis from above (Z1 side), and hence there is such a problem that the chassis structurally lacks strength.

The present invention has been proposed in order to solve the aforementioned problems in view of the contact of the chassis with the atmosphere, and an object of the present invention is to provide a chassis having a stainless steel portion and a Cu or Cu alloy portion joined to each other with high structural strength, whose thickness is reduced and a method for manufacturing the chassis, utilizing the effectiveness of the related art employing stainless steel having high mechanical strength and Cu or a Cu alloy having high heat conductivity.

Means for Solving the Problems

A chassis according to a first aspect of the present invention is made of a clad material in which a first layer made of austenite stainless steel, a second layer made of Cu or a Cu alloy, stacked on the first layer, and a third layer made of austenite stainless steel, stacked on the side of the second layer opposite to the first layer are roll-bonded to each other, and the thickness of the second layer is at least 15% of the thickness of the clad material.

As hereinabove described, the chassis according to the first aspect of the present invention is made of the clad material in which the first layer and the third layer made of austenite stainless steel and the second layer made of Cu or a Cu alloy, held between both layers are pressure-bonded to each other. The clad material is obtained by roll-bonding the layers to each other without forming any steps or the like on the layers. Therefore, the clad material is applied to the chassis, whereby the thickness of the chassis can be further reduced than ever before by not providing the aforementioned steps etc. Furthermore, in the chassis to which the clad material is applied, the fitting structure of components shown in FIG. 14 is not required. Thus, damage to the chassis resulting from external force applied in the normal usage mode can be suppressed without being concerned about the chassis partially coming off.

The "chassis" according to the present invention is used when good heat radiation performance and high mechanical strength are required. The "chassis" according to the present invention includes a chassis for protecting an electronic component in a portable device, such as a chassis for protecting a display portion for displaying an image from an external shock or a chassis for protecting an integrated circuit mounted on a substrate of the portable device, for example. The "chassis" according to the present invention also includes a chassis for improving the mechanical strength of the entire portable device, such as a frame body of the portable device, a chassis serving as a lead for electrical connection, a chassis for electromagnetic shielding, etc.

Furthermore, the austenite stainless steel is applied to the first layer and the third layer each having a large atmospherically-exposed area, whereby corrosion resistance can be imparted to a surface of the chassis, and hence failure resulting from magnetizing or corrosion can be suppressed. In addition, the Cu or the Cu alloy excellent in heat radiation performance among metal materials is applied to the second layer held between the first layer and the third layer. The thickness of the second layer is set to at least 15% of the thickness of the clad material, whereby the thickness of the second layer made of Cu or a Cu alloy excellent in heat conductivity can be sufficiently ensured. For example, good heat radiation performance equivalent or more to a temperature difference (20° C.) between before and after bonding, obtained in a chassis obtained by bonding a graphite sheet onto the aforementioned chassis made of stainless steel can be obtained. Thus, heat from an electronic component easily generating heat can be promptly distributed over the entire chassis and be radiated. This point has been already confirmed through measurement conducted by the inventors, described later. In addition, the thickness of the second layer may be increased without limit beyond 15% within a range where a reduction in mechanical strength is practically allowed. If the thickness of the second layer is set to not more than 80% of the thickness of the clad material, for example, excellent heat radiation performance can be conceivably obtained.

Moreover, the first layer and the third layer are made of austenite stainless steel, whereby magnetizing of the first layer and the third layer can be suppressed, unlike the case where the first layer and the third layer are made of ferritic stainless steel, martensitic stainless steel, or the like, which is ferromagnetic. Thus, failure of a portable device or the like employing the chassis, resulting from the magnetic force of the magnetized first and third layers can be suppressed. Furthermore, corrosion of the first and third layers can be suppressed, unlike the case where the first layer and the third layer are made of ferritic stainless steel.

In the aforementioned chassis according to the first aspect, the preferable lower limit of the thickness of the second layer is 20% of the thickness of the clad material, and the more preferable lower limit is 30% of the thickness of the clad material. According to this structure, the proportion of Cu or a Cu alloy superior in heat conductivity to stainless steel is increased, and hence better heat radiation performance can be obtained. This point has been already confirmed through measurement conducted by the inventors, described later.

In the aforementioned chassis according to the first aspect, the preferable upper limit of the thickness of the second layer is 60% of the thickness of the clad material, and the more preferable upper limit is 50% of the thickness of the clad material. According to this structure, the thicknesses of the first layer and the third layer made of austenite stainless steel having high mechanical strength can be sufficiently ensured. When the mechanical strength is evaluated at 0.2% proof strength, for example, mechanical strength of about 400 MPa generally obtained in terms of prevention of deformation of the chassis or high mechanical strength exceeding this value can be obtained.

In the aforementioned chassis according to the first aspect, the first layer and the third layer are preferably made of austenite stainless steel. In this case, the average value of the thickness of the third layer is preferably at least 95% and not more than 105% of the average value of the thickness of the first layer. According to this structure, the chassis can be configured to be substantially symmetrical in a thickness direction. In other words, the first and third layers can be made of the same material (austenite stainless steel), and the thicknesses thereof can be set to be substantially equal to each other. Thus, a distinction between the front side and back side of the chassis is not required, and handling in a manufacturing process or the like can be facilitated. Furthermore, the hardness of the third layer is set to ±30 HV of the hardness of the first layer, whereby the risk of developing problems with preparation and processing of the chassis due to a difference between the characteristics of the first layer and the third layer during formation, press processing, or the like of the clad material can be reduced.

In the aforementioned chassis according to the first aspect, the thickness of the clad material can be reduced to not more than 0.3 mm. Even in the case where the thickness of the chassis is reduced in this manner, good heat radiation performance is obtained by the second layer having a thickness of at least 15% of the thickness of the clad material, and high mechanical strength is obtained by the first and third layers made of austenite stainless steel, whereby the chassis having heat radiation performance and mechanical strength sufficiently suitable for practical use can be obtained.

In the aforementioned chassis according to the first aspect, the first layer and the third layer are preferably made of austenite stainless steel, and the second layer is preferably made of Cu. According to this structure, the heat radiation performance of the chassis can be further improved by the second layer made of Cu having higher heat conductivity.

In the case where austenite stainless steel is applied to the first layer and the third layer, as described above, SUS 304 widely used, easily available, and easily recycled is preferably selected. The structure of the SUS 304 may become martensitic due to processing during formation, press processing, or the like of the clad material and the SUS 304 may be magnetized, but the SUS 304 is likely to be demagnetized by heat treatment or the like performed in the manufacturing process. Thus, the chassis finally obtained is much less likely to be magnetized. In addition, SUS 301 is also preferably selected for the first layer and the third layer, the materials for which are the same as each other. The SUS 301 is easily available and recycled, similarly to the SUS 304, and the mechanical strength thereof is higher than that of the SUS 304 as described later. Thus, the mechanical strength of the chassis can be improved. The SUS 301 having a smaller amount of Ni than the SUS 304 is also less likely to be magnetized.

In the aforementioned chassis according to the first aspect, a surface metal layer is preferably formed on at least a part of the surface of the chassis. According to this structure, in the chassis, corrosion resistance can be improved, contact resistance can be reduced, and solderability can be improved by the surface metal layer. Furthermore, the surface metal layer is more preferably formed on a substantially entire surface of the chassis. Thus, in the substantially entire surface of the chassis, corrosion resistance can be improved, contact resistance can be reduced, and solderability can be improved.

In the chassis formed with the surface metal layer, the surface metal layer is preferably formed on at least the part of the surface of the chassis by plating. Thus, the surface metal layer can be easily formed. Particularly in the case the surface metal layer is formed on the substantially entire surface of the chassis, no mask is required to be formed at a position where no surface metal layer is formed, and hence the surface metal layer can be more easily formed by plating. Plating employed for formation may be electrolytic plating or non-electrolytic plating.

In the chassis formed with the surface metal layer, the surface metal layer is preferably roll-bonded onto at least a part of the chassis. According to this structure, in addition to the first, second, and third layers, the surface metal layer is roll-bonded, whereby no step for forming the surface metal layer in the clad material including the first, second, and third layers is required to be provided separately, and hence the manufacturing process can be simplified, and the productivity can be improved.

In the chassis having the surface metal layer, the surface metal layer on at least the part of the chassis is preferably a surface metal layer (plating layer, for example) made of Sn or a Sn alloy. In the case where a chassis having no surface metal layer (Sn-based surface metal layer) made of Sn or a Sn alloy is soldered to a supporting portion or the like, Sn contained in the solder may be abnormally grown (whisker), and hence the Sn-based surface metal layer is preferably formed on at least a portion of the chassis involved in soldering. In view of productivity or the like, the Sn-based surface metal layer is more preferably formed on substantially entire front and rear surfaces (both sides) of the chassis made of austenite stainless steel.

In the chassis having the surface metal layer, the surface metal layer is preferably made of Ni or a Ni alloy. According to this structure, an increase in electric resistance (contact resistance) in a contact portion between the chassis and another member can be suppressed by the surface metal layer (Ni-based surface metal layer) made of Ni or a Ni alloy, and hence the chassis can be employed as not only a heat radiation member and a structural member for protecting from a shock but also a current circuit for earthing an electric circuit. In other words, the chassis can be more effectively employed. Furthermore, the surface metal layer made of Ni or a Ni alloy having high corrosion resistance is formed on the surface of the chassis, whereby the corrosion resistance of the chassis can be improved. The surface metal layer made of Ni or a Ni alloy is preferably formed on at least a portion of the chassis connected to the circuit. In view of productivity or the like, this surface metal layer made of Ni or a Ni alloy is more preferably formed on the substantially entire front and rear surfaces (both sides).

The chassis according to the present invention can be employed as a chassis of a portable device intrinsically containing an electronic component radiating heat. The aforementioned chassis according to the present invention, the thickness of which can be reduced, is applied to the portable device required to be downsized, whereby the portable device can be reduced in size (thickness) and weight by at least a reduction in the thickness of the chassis. Furthermore, heat from the electronic component easily generating heat can be efficiently radiated through the chassis according to the present invention, and hence accumulation of heat in the electronic component can be suppressed, and malfunction of the electronic component resulting from accumulated heat can be suppressed. In the case where the electronic component radiating heat is in contact with the chassis, the heat from the electronic component can be more efficiently radiated. The "electronic component" includes not only a component utilizing the electric power of a display, an integrated circuit (IC), or the like but also a component supplying electric power to a battery or the like.

A method for manufacturing a chassis according to a second aspect of the present invention includes a step of roll-bonding a first layer made of austenite stainless steel, a second layer made of Cu or a Cu alloy, and a third layer made of austenite stainless steel to each other in a state where the first layer, the second layer, and the third layer are stacked in this order to form a clad material such that the thickness of the second layer is at least 15% of the thickness of the clad material, and the step of forming the clad material includes a step of roll-bonding the first layer, the second layer, and the third layer in a stacked state and a step of diffusion-annealing the clad material.

In the method for manufacturing a chassis according to the second aspect of the present invention, as hereinabove described, the clad material is formed such that the thickness of the second layer is at least 15% of the thickness of the clad material by roll-bonding the first layer made of austenite stainless steel, the second layer made of Cu or a Cu alloy, and the third layer made of austenite stainless steel to each other in the state where the first layer, the second layer, and the third layer are stacked in this order. The clad material is obtained by roll-bonding the layers to each other without forming any steps or the like on the layers. Therefore, the clad material is applied to the chassis, whereby the thickness of the chassis can be further reduced than ever before by not providing the aforementioned steps etc. Furthermore, no fitting structure is required in the clad material, and hence the method for manufacturing a chassis capable of suppressing damage to the chassis resulting from external force applied in the normal usage mode without being concerned about the chassis partially coming off can be provided.

Furthermore, the step of forming the clad material includes the step of roll-bonding the first layer, the second layer, and the third layer in the stacked state and the step of diffusion-annealing the clad material, whereby even in the case where the first and third layers made of austenite stainless steel become martensitic and are magnetized in the roll-bonding step, the first and third layers can be demagnetized in the diffusion-annealing step. Thus, manufacturing of the magnetized chassis can be suppressed.

In the aforementioned method for manufacturing a chassis according to the second aspect, the step of roll-bonding the first layer, the second layer, and the third layer in the stacked state and the step of diffusion-annealing the clad material are preferably alternately performed a plurality of times. Thus, even in the case where the clad material is gradually rolled and thinned by performing the rolling step a plurality of times, the clad material can be demagnetized in the subsequent diffusion-annealing step. Consequently, manufacturing of the magnetized chassis can be reliably suppressed.

Effects of the Invention

According to the present invention, as hereinabove described, the clad material in which the austenite stainless steel known to have excellent corrosion resistance and the Cu or Cu alloy known to have good heat conductivity are properly combined is applied, whereby a novel chassis having good heat radiation performance, high mechanical strength, and corrosion resistance in terms of material quality, in which the layers are bonded to each other with high strength in terms of structure, the thickness of which is reduced, can be obtained. This chassis is particularly suitable for a chassis for the portable device intrinsically containing the electronic component radiating heat.

BRIEF DESCRIPTION OF THE DRAWINGS

[FIG. 7] A table showing measurement results of chassis and plate materials employing SUS 304 in measurement conducted in order to confirm the effects of the present invention.

MODES FOR CARRYING OUT THE INVENTION

An embodiment embodying the present invention is hereinafter described on the basis of the drawings.

The internal structure of a portable device 100 according to the embodiment of the present invention is now described with reference to FIGS. 1 to 3.

Figure 1:
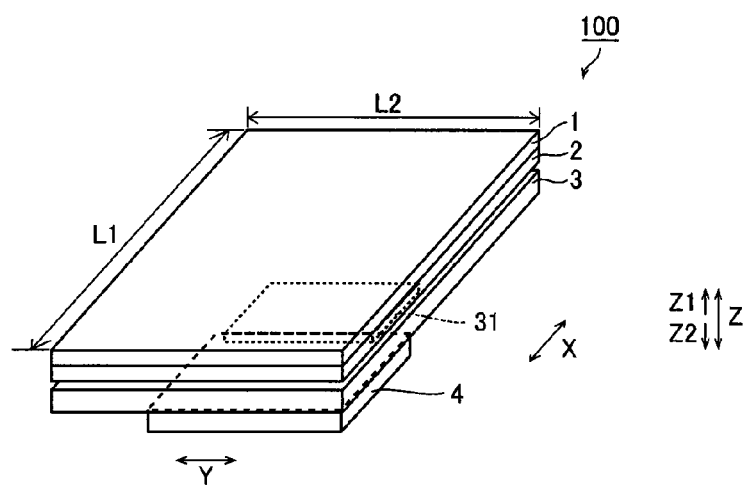
[FIG. 1] A perspective view showing the internal structure of a portable device according to an embodiment of the present invention.
Figure 2:
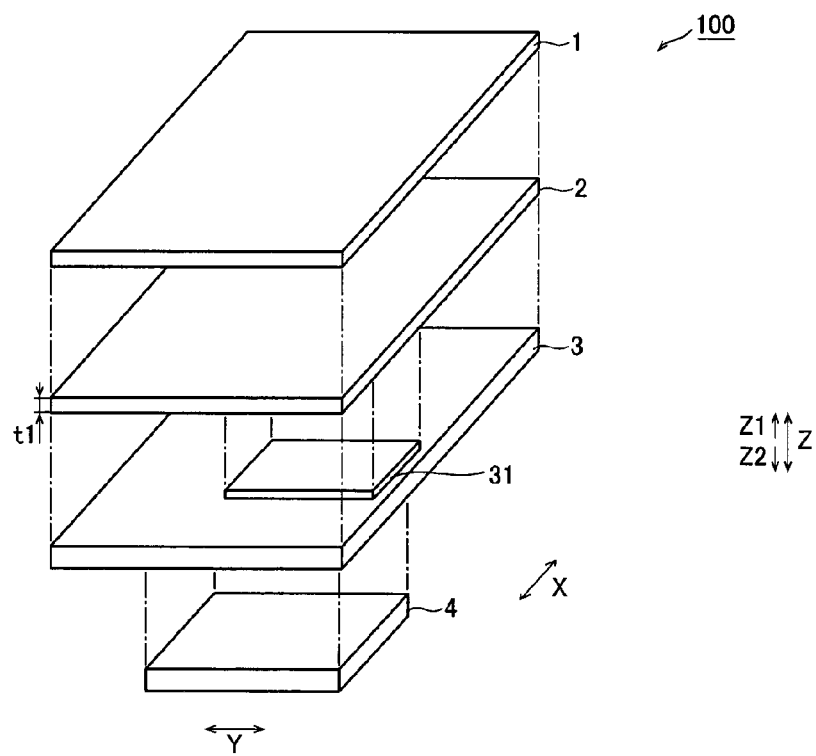
[FIG. 2] An exploded perspective view showing the internal structure of the portable device according to the embodiment of the present invention.

In the portable device 100 according to this embodiment, a display 1, a chassis 2, a substrate 3, and a battery 4 are arranged in this order from the upper side (Z1 side), as shown in FIGS. 1 and 2. The display 1, the chassis 2, and the substrate 3 each have a length L1 of about 100 mm in a longitudinal direction in a plan view and are formed in a substantially rectangular shape having a length L2 of about 50 mm in a short-side direction. The battery 4 is formed in a rectangular shape smaller than that of the substrate 3 in the plan view.

The display 1 is a liquid crystal display, an organic EL display, or the like and has a function of displaying an image on the upper surface on the Z1 side. The lower surface of this display 1 on a Z2 side comes into contact with (is in contact with) the upper surface of the chassis 2 on the Z1 side. In other words, the display 1 is arranged in the vicinity of the chassis 2. The display 1 is configured to generate heat when displaying the image and radiate the heat generated in the display 1 to an external portion mainly through the chassis 2. The display 1 is an example of the "electronic component" in the present invention.

The chassis 2 is made of a substantially rectangular plate material having a thickness t1 of about 0.3 mm in a direction Z. This chassis 2 has a function of protecting the display 1 from an external shock and a function of radiating heat from the display 1 and a CPU 31 to an external portion. The battery 4 has a function of supplying electric power to the display 1, the substrate 3, etc. and is arranged on the lower surface of the substrate 3 on the Z2 side.

The CPU 31 executing a program or the like for controlling the portable device 100 is provided on the upper surface of the substrate 3 on the Z1 side. The upper surface of this CPU 31 on the Z1 side comes into contact with (is in contact with) the lower surface of the chassis 2 on the Z2 side. In other words, the CPU 31 is arranged in the vicinity of the chassis 2. The CPU 31 is configured to generate heat by executing the program or the like for controlling the entire portable device 100 and radiate the heat generated in the CPU 31 to an external portion mainly through the chassis 2. The CPU 31 is an example of the "electronic component" in the present invention.

Figure 3:
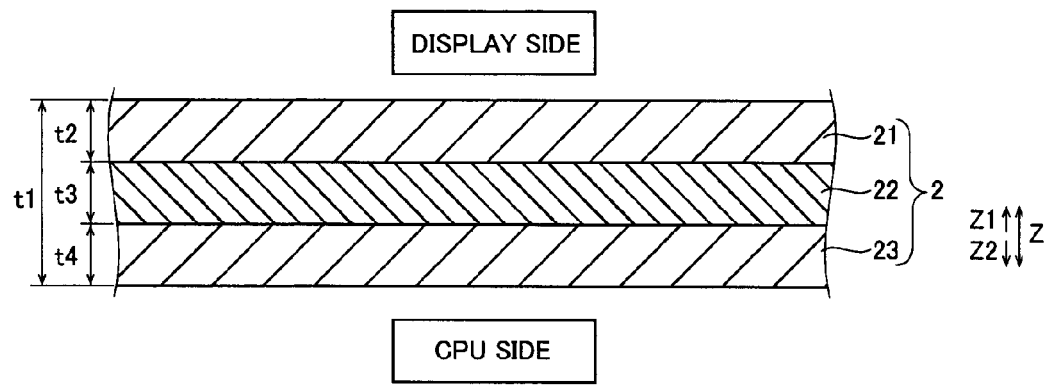
[FIG. 3] A sectional view showing the structure of a chassis of the portable device according to the embodiment of the present invention.

According to this embodiment, the chassis 2 is made of a three-layered clad material in which an SUS (Steel Use Stainless) layer 21, a Cu layer 22 stacked on the lower surface of the SUS layer 21 on the Z2 side, and an SUS layer 23 stacked on the lower surface (a side opposite to the upper surface on the Z1 side on which the SUS layer 21 is stacked)

of the Cu layer 22 on the Z2 side are pressure-bonded to each other, as shown in FIG. 3. These SUS layers 21 and 23 and the Cu layer 22 are tightly bonded to each other by roll-bonding. The SUS layer 21, the Cu layer 22, and the SUS layer 23 are examples of the "first layer", the "second layer", and the "third layer" in the present invention, respectively.

The SUS layer 21 and the SUS layer 23 are made of SUS 304 and SUS 301, both of which are austenitic stainless steel. In other words, the SUS layer 21 and the SUS layer 23 are made of the austenitic stainless steel whose material qualities such as chemical components and structural forms are equal to each other. The SUS 304 and the SUS 301 are non-magnetic in terms of material quality and normally have non-magnetic properties. The Cu layer 22 is made of Cu whose purity is at least 99.9%, such as oxygen-free copper, tough pitch copper, or phosphorous-deoxidized copper.

The SUS 304 and the SUS 301 each have heat conductivity of about 15 W/(m×K). On the other hand, the Cu has heat conductivity of about 400 W/(m×K). In other words, the Cu has heat conductivity higher than those of the SUS 304 and the SUS 301.

The SUS 304 has a 0.2% proof strength of about 840 MPa, and the SUS 301 has a 0.2% proof strength equal to or slightly higher than that of the SUS 304. On the other hand, the Cu has a 0.2% proof strength of about 200 MPa. In other words, the SUS 304 and the SUS 301 have mechanical strength higher than that of the Cu.

According to this embodiment, the SUS layer 21, the Cu layer 22, and the SUS layer 23 have thicknesses t2, t3, and t4 in the direction Z, respectively. The thickness t2 of the SUS layer 21 and the thickness t4 of the SUS layer 23 are substantially equal to each other. The interfaces of the SUS layer 21, the Cu layer 22, and the SUS layer 23 may not be flat but be waved. In this case, when the average value of the thickness t2 of the SUS layer 21 is at least 95% and not more than 105% of the average value of the thickness t4 of the SUS layer 23, the thickness t2 of the SUS layer 21 and the thickness t4 of the SUS layer 23 can be considered to be substantially equal to each other in actual manufacture.

The ratio of the thickness t3 of the Cu layer 22 to the thickness t1 (=t2+t3+t4) of the chassis 2 is at least 15%. The ratio of the thickness t3 of the Cu layer 22 is preferably at least about 20% of the thickness t1 of the chassis 2 and is more preferably at least about 30% of the thickness t1 of the chassis 2. The ratio of the thickness t3 of the Cu layer 22 is preferably not more than about 60% of the thickness t1 of the chassis 2 and is more preferably not more than about 50% of the thickness t1 of the chassis 2.

A process for manufacturing the chassis 2 according to the embodiment of the present invention is now described with reference to FIGS. 1, 3, and 4.

Figure 4:
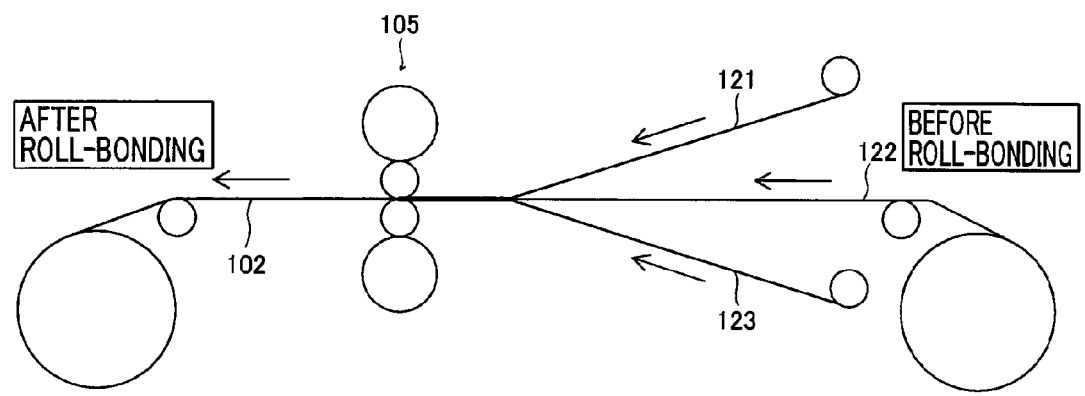
[FIG. 4] A schematic view for illustrating a process for manufacturing the chassis of the portable device according to the embodiment of the present invention.

First, an SUS plate material 121 and an SUS plate material 123 made of either SUS 304 or SUS 301 and a Cu plate material 122 made of Cu are prepared, as shown in FIG. 4. At this time, the thicknesses of the plate materials are adjusted such that the thickness of the SUS plate material 121 and the thickness of the SUS plate material 123 are substantially equal to each other and the thickness of the Cu plate material 122 is at least 15% of the total thickness of the thickness of the SUS plate material 121, the thickness of the Cu plate material 122, and the thickness of the SUS plate material 123.

In a state where the Cu plate material 122 is arranged between the SUS plate material 121 and the SUS plate material 123, roll-bonding is continuously performed by a roller 105 at a rolling reduction of about 60%. Thus, a clad material 102 in which the SUS layer 21, the Cu layer 22, and the SUS layer 23 are stacked in this order, having a thickness of about 1 mm is continuously formed.

Thereafter, the formed clad material 102 is diffusion-annealed under a reducing atmosphere at about 1000° C. Then, the clad material 102 is continuously rolled until the thickness thereof becomes about ⅓ (target value: 0.33 mm). The clad material 102 is diffusion-annealed again under a reducing atmosphere at about 1000° C. and thereafter is continuously rolled at a rolling reduction of about 10%. Thus, the clad material 102 having a thickness t1 (see FIG. 3) of about 0.3 mm is continuously formed. In the case where the SUS 304 and the SUS 301 are rolled at a large rolling reduction, the structures of the SUS 304 and the SUS 301 may become martensitic due to the rolling, and the SUS 304 and the SUS 301 may be magnetized. However, the aforementioned diffusion-annealing is performed for demagnetization, and hence no particular problems may arise.

Thereafter, the clad 102 (see FIG. 4) is punched in a substantially rectangular shape having a length L1 of about 100 mm in the longitudinal direction and a length L2 of about 50 mm in the short-side direction, as shown in FIG. 1, whereby the chassis 2 is manufactured. The chassis 2 is processed in a prescribed shape by pressing or the like.

Figure 14:
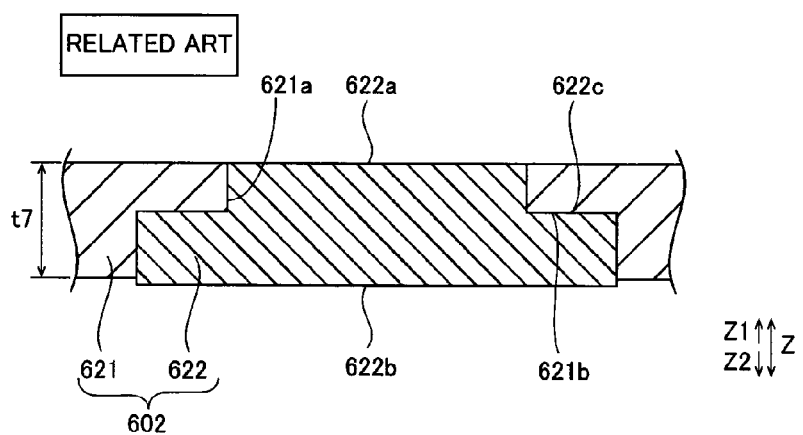
[FIG. 14] A sectional view for illustrating the related art disclosed in Japanese Patent Laying-Open No. 2007-12928.

According to this embodiment, as hereinabove described, the chassis 2 is made of the three-layered clad material in which the SUS layer 21, the Cu layer 22 stacked on the lower surface of the SUS layer 21 on the Z2 side, and the SUS layer 23 stacked on the lower surface of the Cu layer 22 on the Z2 side are pressure-bonded to each other. Thus, the layers can be bonded to each other without forming any steps, and the thickness t1 of the chassis 2 can be reduced. Consequently, the portable device 100 can be reduced in size (thickness) and weight by at least a reduction in the thickness t1 of the chassis 2. Furthermore, a fitting structure shown in FIG. 14 is not required, and hence damage to the chassis 2 resulting from external force applied in the normal usage mode can be suppressed without being concerned about the chassis 2 partially coming off.

According to this embodiment, the layers are tightly bonded to each other by rolling in a stacked state, and hence the SUS layers 21 and 23 made of SUS 304 or SUS 301 and the Cu layer 22 made of Cu which have been bonded to each other are not easily separated from each other due to external force in a thickness direction (direction Z).

According to this embodiment, the SUS 304 or the SUS 301 which is austenitic stainless steel having high mechanical strength is located on both the Z1 side and the Z2 side of the chassis 2, and hence the mechanical strength of the chassis 2 can be easily improved. Furthermore, corrosion resistance can be imparted to a surface of the chassis 2, and hence failure resulting from magnetizing or corrosion can be suppressed.

According to this embodiment, the thickness t3 of the Cu layer 22 is at least 15% of the thickness t1 of the chassis 2, whereby the thickness t3 of the Cu layer 22 made of Cu which is excellent in heat conductivity can be sufficiently ensured, and hence the heat from the CPU 31 can be promptly distributed over the entire chassis 2 and be radiated. Thus, the heat can be radiated from the entire chassis 2 to the external portion, and hence good heat radiation performance can be obtained. The thickness t3 of the Cu layer 22 is preferably not more than 60% of the thickness t1 of the chassis 2 and is more preferably not more than 50% of the thickness t1 of the chassis 2, for example. According to this structure, the chassis 2 has heat radiation characteristics due to the Cu layer 22, and the thickness t2 of the SUS layer 21 and the thickness t4 of the SUS layer 23, which are made of SUS 304 or SUS 301 having high mechanical strength, can be sufficiently ensured.

According to this embodiment, the SUS layers 21 and 23 are made of SUS 304 or SUS 301 which is non-magnetic austenite stainless steel in terms of material quality, whereby magnetizing of the SUS layers 21 and 23 can be suppressed. Therefore, failure of the portable device resulting from magnetic force generated by magnetizing of the chassis can be suppressed. In other words, magnetizing of the SUS layers 21 and 23 finally formed in the chassis 2 is suppressed. Furthermore, corrosion can be suppressed by employing the SUS layers 21 and 23 made of austenite stainless steel excellent in corrosion resistance. In addition, the easily available SUS 304 or SUS 301 is employed for the SUS layers 21 and 23, and hence the manufacturing cost of the chassis 2 can be reduced.

According to this embodiment, better heat radiation performance can be obtained when the thickness t3 of the Cu layer 22 is 20% or more of the thickness t1 of the chassis 2, and even better heat radiation performance can be obtained when the thickness t3 of the Cu layer 22 is 30% or more of the thickness t1 of the chassis 2.

According to this embodiment, the SUS layers 21 and 23 are made of austenite stainless steel whose material qualities such as the chemical components and the structural forms are equal to each other, and the thickness t2 of the SUS layer 21 and the thickness t4 of the SUS layer 23 are substantially equal to each other. Thus, a distinction between the front side and back side of the chassis 2 is not required, and handling in the manufacturing process or the like can be facilitated. Furthermore, the processing characteristics of the SUS layer 21 and the SUS layer 23 can be made substantially identical to each other, and hence the risk of developing problems with preparation and processing of the chassis 2 due to a difference between the processing characteristics of the SUS layer 21 and the SUS layer 23 during formation, press processing, or the like of the clad material 102 can be reduced.

According to this embodiment, the thickness of the clad material can be set to 0.3 mm, as described above, whereby the thickness t1 of the chassis 2 is sufficiently reduced by employing this clad material. Thus, the portable device 100 can be easily reduced in thickness and weight. Furthermore, the Cu layer 22 is made of Cu having higher heat conductivity, whereby the heat conductivity of the chassis 2 can be effectively improved.

According to this embodiment, making the SUS layers 21 and 23 of SUS 304 having a larger amount of Ni than SUS 301 is advantageous in terms of being less likely to magnetize the SUS layers 21 and 23 during the formation or the press processing of the clad material 102. In other words, if the SUS 304 not the SUS 301 is employed for the SUS layers 21 and 23, magnetizing of the chassis 2 finally obtained can be more easily suppressed.

According to this embodiment, if the SUS layers 21 and 23 are made of SUS 301 having higher mechanical strength than SUS 304, the mechanical strength of the chassis 2 can be improved while the heat radiation performance of the chassis 2 is ensured. This point is described later on the basis of FIG. 8.

According to this embodiment, the display 1 and the CPU 31 are arranged in the vicinity of the chassis 2 having good heat radiation performance, as shown in FIG. 1, whereby the heat from the display 1 and the CPU 31 can be effectively radiated through the chassis 2. Furthermore, the display 1 and the CPU 31 are brought into contact with the chassis 2 having good heat radiation performance, whereby the heat from the display 1 and the CPU 31 can be more effectively radiated through the chassis 2. Thus, accumulation of the heat in the display 1 and the CPU 31 can be suppressed, and hence malfunction of the display 1 and the CPU 31 resulting from the heat can be suppressed.

According to this embodiment, roll-bonding is continuously performed by the roller 105 at a rolling reduction of about 60% in the state where the Cu plate material 122 is arranged between the SUS plate material 121 and the SUS plate material 123, and thereafter the formed clad material 102 is diffusion-annealed under a reducing atmosphere at about 1000° C. In addition, the clad material 102 is continuously rolled until the thickness thereof becomes about ⅓. Moreover, the clad material 102 is diffusion-annealed again under a reducing atmosphere at about 1000° C. and thereafter is continuously rolled at a rolling reduction of about 10%. Even in the case where the SUS layers 21 and 23 become martensitic and are magnetized, the SUS layers 21 and 23 made of austenite stainless steel can be demagnetized in the diffusion-annealing step through this manufacturing process. Furthermore, even in the case where the clad material 102 is gradually rolled and thinned by performing the rolling step a plurality of times, the clad material 102 can be demagnetized in the subsequent diffusion-annealing step. Consequently, manufacturing of the magnetized chassis 2 can be reliably suppressed.

EXAMPLES

Measurement of the heat radiation performance and measurement of the mechanical strength conducted in order to confirm the effects of the present invention are now described with reference to FIGS. 2, 3, and 5 to 10. The "thickness" denotes an average value unless otherwise specified.

In each of these Examples, the chassis 2 according to the aforementioned embodiment shown in FIG. 3 was employed. Specifically, the chassis 2 made of the clad material in which the SUS layer 21 made of SUS 304, the Cu layer 22 made of Cu, and the SUS layer 23 made of SUS 304 were stacked in this order was employed as each of Examples 1 to 8 (see FIG. 7). The chassis 2 made of the clad material in which the SUS layer 21 made of SUS 301, the Cu layer 22 made of Cu, and the SUS layer 23 made of SUS 301 were stacked in this order was employed as each of Examples 9 to 13 (see FIG. 8).

In each of Examples 1 to 13, the thickness t1 (=t2+t3+t4, total thickness) of the chassis 2 was set to 0.3 mm, and the thickness t2 of the SUS layer 21 and the thickness t4 of the SUS layer 23 were set to be equal to each other. In Examples 1 to 8 (see FIG. 7) employing the SUS 304, the ratio (Cu thickness ratio) of the thickness t3 of the Cu layer 22 to the thickness t1 of the chassis 2 was set to 15.0%, 20.0%, 30.0%, 34.0%, 42.8%, 50.0%, 55.6%, and 60.0%, respectively. In Examples 9 to 13 (see FIG. 8) employing the SUS 301, the ratio (Cu thickness ratio) of the thickness t3 of the Cu layer 22 was set to 34.0%, 42.8%, 50.0%, 55.6%, and 60.0%, respectively.

As Comparative Example 1 (see FIGS. 7 and 8), a single plate material of SUS 304 having a thickness of 0.3 mm was employed. As Comparative Example 2 (see FIG. 7), a plate material made of a three-layered clad material in which an SUS layer made of SUS 304, a Cu layer made of Cu, and an SUS layer made of SUS 304 were stacked in this order, having a thickness of 0.3 mm was employed, similarly to the aforementioned Examples 1 to 8. In Comparative Example 2, the Cu thickness ratio was set to 14.0%. As Comparative Example 3 (see FIGS. 7 and 8), a single plate material of Cu having a thickness of 0.3 mm was employed. As Comparative Example 4 (see FIG. 7), a plate material prepared by bonding a graphite sheet having a thickness of 30 µm onto the upper surface on the Z1 side (see FIG. 3) of a flat plate made of SUS 304 having a thickness of 0.3 mm was employed. The ratio (sheet thickness/SUS 304 thickness) of the thickness of the aforementioned graphite sheet to the thickness of the aforementioned flat plate made of SUS 304 is 10.0%.

Figure 5:
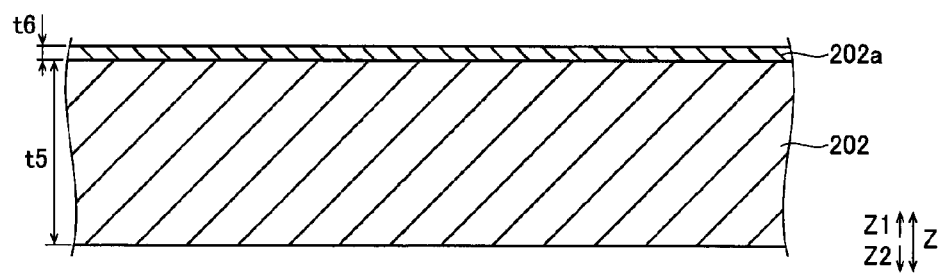
[FIG. 5] A sectional view showing the structure of a plate material formed with a Cu foil layer according to Comparative Example of the present invention.

As Comparative Example 5 (see FIG. 7), a single plate material of SUS 304 having a thickness of 0.4 mm larger than the aforementioned thickness (0.3 mm) of Comparative Example 1 was employed. As Comparative Example 6 (see FIG. 7), a plate material 202 made of SUS 304 having a thickness t5 of 0.4 mm, formed with a Cu foil layer 202a having a thickness t6 of 30 µm on the upper surface on the Z1 side was employed, as shown in FIG. 5. In Comparative Example 6, the Cu foil layer 202a was formed in order to improve the heat radiation performance of the plate material 202. The ratio (Cu foil thickness/SUS 304 thickness) of the thickness t6 of the Cu foil layer 202a to the thickness t5 of the plate material 202 is 7.5%.

(Heat Radiation Performance)

Figure 6:
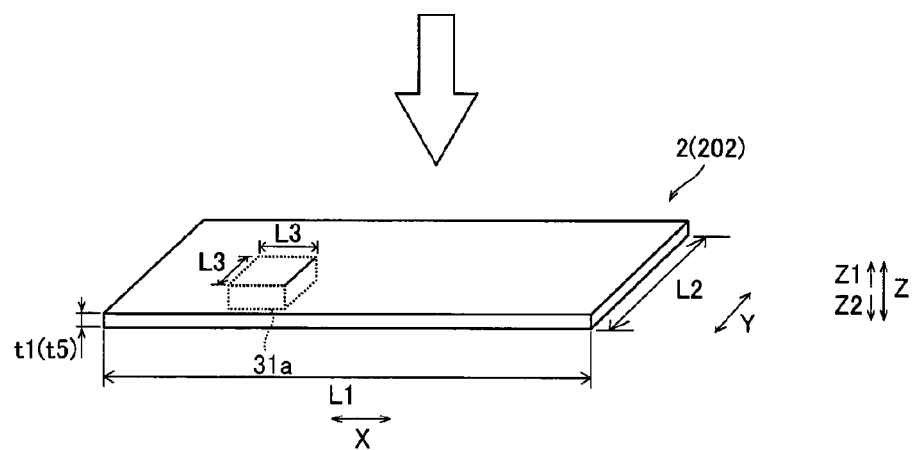
[FIG. 6] A schematic view for illustrating observation of the temperature states of a chassis and a plate material conducted in order to confirm the effects of the present invention.

Temperature distributions in the case of arranging heat generation sources on surfaces of the respective chassis 2 of Examples 1 to 13 and surfaces of the respective plate materials of Comparative Examples 1 to 6 were observed in order to evaluate the heat radiation performance. Specifically, the chassis 2 of each of Examples 1 to 13 having a length L1 of 100 mm in the longitudinal direction (direction X) and a length L2 of 50 mm in the short-side direction (direction Y) and the plate material of each of Comparative Examples 1 to 6 were prepared, as shown in FIG. 6. Then, a heater 31a corresponding to the CPU 31 (see FIG. 2), which is a heat generation source according to this embodiment, was bonded onto the lower surface on the Z2 side of each of the chassis 2 and the plate materials. This heater 31a has a length L3 of 10 mm in the direction X and the direction Y. In each of Comparative Examples 4 and 6, the heater 31a was bonded onto the lower surface on the Z2 side opposite to the upper surface on the Z1 side.

Thereafter, 1 W of electric power was supplied to the heater 31a to heat the heater 31a. After 5 minutes, the temperature distributions of the chassis 2 and the plate materials were observed from above (Z1 side) by an infrared thermography device. Then, the temperatures of portions of the chassis 2 and the plate materials where the temperatures were the highest were measured, and the measurement values were set as maximum temperatures. Thereafter, differences between the maximum temperature (76.7° C.) of Comparative Example 1, which is the single plate material of SUS 304 having a thickness of 0.3 mm, and the maximum temperatures of Examples 1 to 13 and Comparative Examples 2 to 6 were obtained as temperature differentials (hereinafter referred to as the "temperature difference") from Comparative Example 1.

Figures 8, 9:
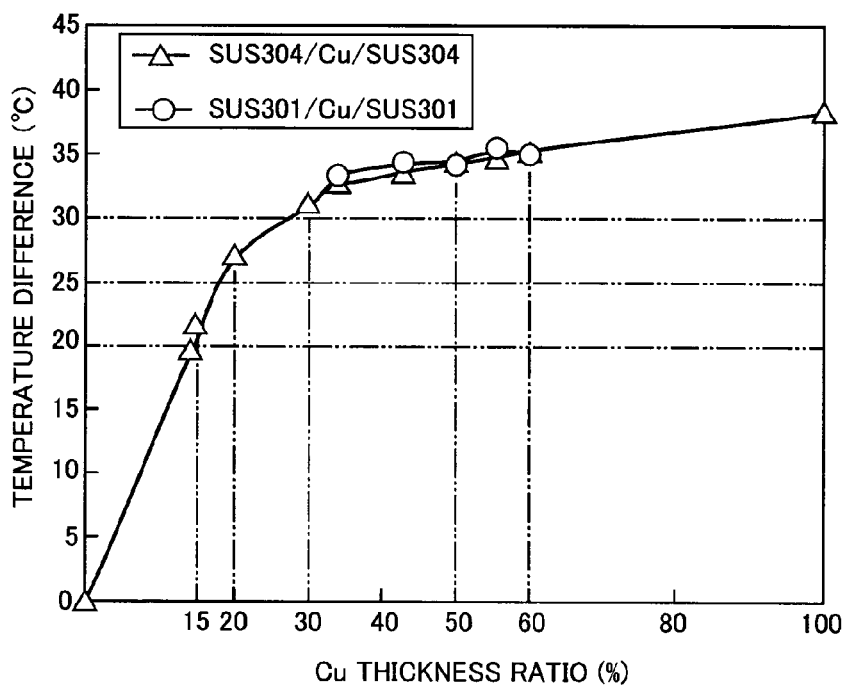
[FIG. 8] A table showing measurement results of chassis and plate materials employing SUS 301 in measurement conducted in order to confirm the effects of the present invention.
[FIG. 9] A graph showing the relationship between a Cu thickness ratio and a temperature difference in measurement conducted in order to confirm the effects of the present invention.

In the chassis 2 of each of Examples 1 to 13 and the plate material of each of Comparative Examples 1 to 3, as the Cu thickness ratio was increased, the maximum temperature was decreased and the temperature difference was increased, as shown in FIGS. 7 to 9. This is conceivably because the heat conductivity of each of the chassis 2 and the plate materials was improved by an increase of the ratio of Cu having high heat conductivity (about 400 W/(m×K)). Therefore, the maximum temperature was decreased.

In each of Examples 1 to 13 and Comparative Example 3 in which the Cu thickness ratio was at least 15.0%, the temperature difference was at least 20° C. In Comparative Example 2 in which the Cu thickness ratio was less than 15.0% (14.0%), on the other hand, the temperature difference was less than 20° C. (19.4° C.). The temperature difference (19.4° C.) generated in Comparative Example 2 is smaller than the temperature difference (20.6° C.) generated in Comparative Example 5 having a thickness (0.4 mm) larger than the thickness (0.3 mm) of Comparative Example 1. Thus, it has been proved that the plate material of Comparative Example 2 is superior in heat radiation performance to the plate material of Comparative Example 1 having the same thickness but is inferior in heat radiation performance to the plate material of Comparative Example 5 having a larger thickness. Consequently, the plate material of Comparative Example 2 is conceivably inadequate to reduce the thickness and obtain good heat radiation performance. On the other hand, it has been confirmed that the thickness can be reduced and good heat radiation performance can be obtained by employing the chassis 2 of each of Examples 1 to 13 and the plate material of Comparative Example 3.

The temperature difference (21.3° C.) generated in Example 1 is slightly different from the temperature difference (21.7° C.) generated in Comparative Example 4 bonded with the graphite sheet, and the temperature differences generated in Examples 2 to 13 and Comparative Example 3 are clearly larger than the temperature difference generated in Comparative Example 4. Thus, it has been confirmed that the thickness can be reduced and good heat radiation performance can be obtained by employing the chassis 2 of each of Examples 1 to 13 and the plate material of Comparative Example 3.

In each of Examples 2 to 13 and Comparative Example 3 in which the Cu thickness ratio was at least 20.0%, the temperature difference was at least 25° C. Thus, it has been confirmed that the thickness can be reduced and better heat radiation performance can be obtained by employing the chassis 2 of each of Examples 2 to 13 and the plate material of Comparative example 3.

In each of Examples 3 to 13 and Comparative Example 3 in which the Cu thickness ratio was at least 30.0%, the temperature difference was at least 30° C. This temperature difference is clearly larger than the temperature difference (28.8° C.) generated in Comparative Example 6 formed with the Cu foil layer 202a (see FIG. 5) for improving the heat radiation performance, having a large thickness (0.4 mm). Thus, it has been confirmed that the thickness can be reduced and even better heat radiation performance can be obtained by employing the chassis 2 of each of Examples 3 to 13 and the plate material of Comparative example 3 since sufficient heat radiation performance can be obtained without providing the Cu foil layer for improving the heat radiation performance.

Furthermore, it has been confirmed from the results of Examples 1 to 8 and Comparative examples 1 to 3 shown in FIGS. 7 and 9 that as the Cu thickness ratio i.e., the ratio of the thickness of the Cu layer (second layer) to the thickness of the clad material is increased, the rate of increase in the temperature difference from Comparative Example 1 is decreased. It has been confirmed from the results of Examples 4 to 7 and 9 to 12 shown in FIGS. 7 to 9 that the temperature difference is slightly decreased in the case where the SUS layers 21 and 23 are made of SUS 304 as compared with the case where the SUS layers 21 and 23 are made of SUS 301. However, this amount of change is not regarded as a clear difference, and it has been confirmed that the material quality of austenite stainless steel does not significantly influence the superiority and inferiority of the heat radiation performance.

(Mechanical Strength)

In order to evaluate the mechanical strength, stress-strain diagrams of the chassis 2 of each of Examples 1 to 13 and the plate material of each of Comparative Examples 1 to 6 were measured, and stress (0.2% proof strength) was obtained when a permanent strain of 0.2% was generated.

Figure 10:
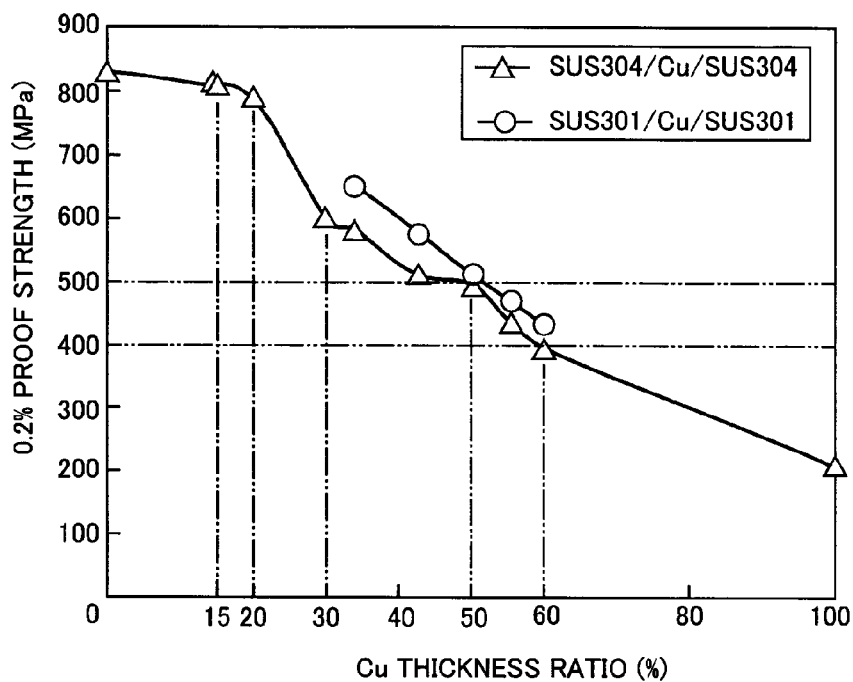
[FIG. 10] A graph showing the relationship between a Cu thickness ratio and 0.2% proof strength in measurement conducted in order to confirm the effects of the present invention.

The 0.2% proof strength of each chassis 2 and each plate material was decreased as the Cu thickness ratios were increased, as shown in FIGS. 7, 8, and 10. In each of Examples 1 to 13 and Comparative Examples 1 and 2 in which the Cu thickness ratio was not more than 60%, the 0.2% proof strength was at least 400 MPa. The 0.2% proof strength (395 MPa) in Example 8 was less than 400 MPa, but this is most likely due to variations in manufacturing. In Comparative Example 3 in which the Cu thickness ratio was more than 60% (100.0%), on the other hand, the 0.2% proof strength was less than 400 MPa (210 MPa). Thus, the plate material of Comparative Example 3 is conceivably inadequate to reduce the thickness and obtain high mechanical strength. On the other hand, it has been confirmed that the thickness can be reduced and high mechanical strength can be obtained by employing the chassis 2 of each of Examples 1 to 13 and the plate material of each of Comparative Examples 1 and 2.

In each of Examples 1 to 5 and Comparative Examples 1 and 2 in which the SUS layers 21 and 23 were made of SUS 304 and the Cu thickness ratio was not more than 42.8%, the 0.2% proof strength was at least 500 MPa. Similarly, in each of Examples 9 to 11 in which the SUS layers 21 and 23 were made of SUS 301 and the Cu thickness ratio was not more than 50.0%, the 0.2% proof strength was at least 500 MPa. Thus, it has been confirmed that the thickness can be reduced and high mechanical strength can be obtained by employing the chassis 2 of each of Examples 1 to 5 and 9 to 11 and the plate material of each of Comparative Examples 1 and 2.

It has been proved from the results of Examples 4 to 8 and 9 to 13 that the 0.2% proof strength is slightly larger in the case where the SUS layers 21 and 23 are made of SUS 301 as compared with the case where the SUS layers 21 and 23 are made of SUS 304. When the Cu thickness ratio was 34.0%, for example, the 0.2% proof strength (649 MPa) of Example 9 (SUS 301) was larger by 66 MPa than the 0.2% proof strength (583 MPa) of Example 4 (SUS 304). Consequently, it has been confirmed that the chassis 2 having higher mechanical strength can be obtained by making the SUS layers 21 and 23 of SUS 301.

It has been proved on the basis of the aforementioned evaluations of the heat radiation performance and the mechanical strength that as the Cu thickness ratio is increased, the temperature differential (temperature difference) from Comparative Example 1 is increased and the heat radiation performance is improved, but the 0.2% proof strength and the mechanical strength are decreased. Furthermore, it has been proved that the thickness can be reduced and good heat radiation performance can be obtained by employing the chassis 2 of each of Examples 1 to 13 in which the Cu thickness ratio is at least 15.0%. In addition, it has been proved that the thickness can be reduced and better heat radiation performance can be obtained by employing the chassis 2 of each of Examples 3 to 5 and 9 to 11 in which the Cu thickness ratio is at least 30.0%. Moreover, it has been proved that the upper limit of the Cu thickness ratio is preferably not more than 60% in order to achieve the aforementioned chassis having good heat radiation performance and higher mechanical strength and is more preferably not more than 50%.

The embodiment and Examples disclosed this time must be considered as illustrative in all points and not restrictive. The range of the present invention is shown not by the above description of the embodiment and Examples but by the scope of claims for patent, and all modifications within the meaning and range equivalent to the scope of claims for patent are further included.

Figure 11:
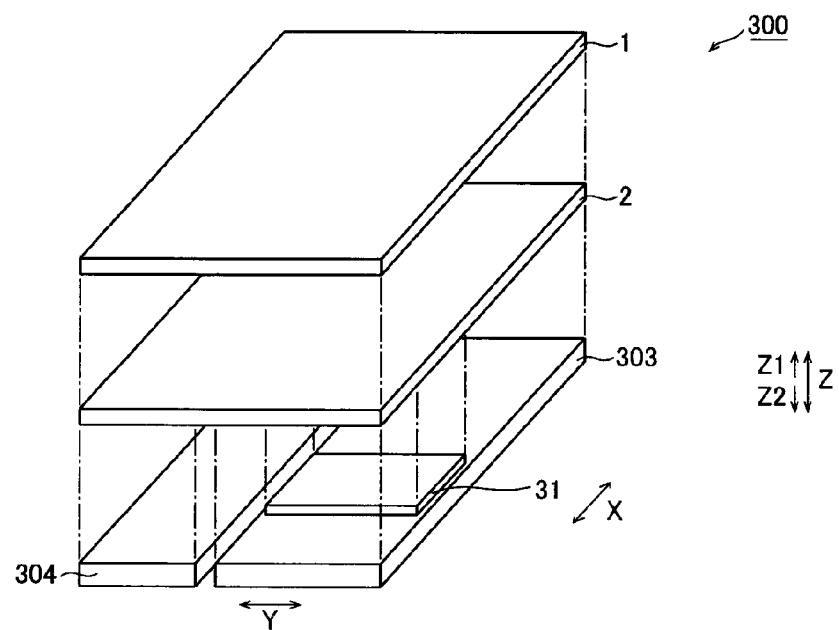
[FIG. 11] An exploded perspective view showing the internal structure of a portable device according to a first modification of the embodiment of the present invention.

For example, while the example of arranging the battery 4 on the lower surface side of the substrate 3 on the Z2 side has been shown in the aforementioned embodiment, the present invention is not restricted to this. According to the present invention, a battery 304 may be arranged adjacent to a substrate 303 in a short-side direction (direction Y), and both a CPU 31 and the battery 304 may be brought into contact with a chassis 2, as in a portable device 300 according to a first modification of the aforementioned embodiment shown in FIG. 11. Thus, the chassis 2 can efficiently radiate not only heat from a display 1 and the CPU 31 but also heat from the battery 304. The battery 304 is an example of the "electronic component" in the present invention.

While the example of bringing the upper surface of the CPU 31 on the Z1 side into contact with the lower surface of the chassis 2 on the Z2 side has been shown in FIG. 1 in the aforementioned embodiment, the present invention is not restricted to this. According to the present invention, the CPU may not be brought into contact with the chassis. For example, a supporting portion 433 in the form of a frame surrounding a CPU 31 may be bonded onto the upper surface (a surface on a Z1 side) of a substrate 403 by solder 432 as in a second modification of the aforementioned embodiment shown in FIG. 12. Then, a chassis 402 may be fixed to the supporting portion 433 to bring the lower surface (a surface on a Z2 side) of the chassis 402 in the form of a lid, made of a three-layered clad material into contact with the upper surface of the supporting portion 433. Thus, the chassis 402 having good heat radiation performance and high mechanical strength is arranged in the vicinity of the CPU 31, and hence the mechanical strength of a portable device provided with the substrate 403 can be ensured while the chassis 402 effectively radiates heat from the CPU 31 easily generating heat. At this time, the supporting portion 433 is preferably made of austenite stainless steel such as SUS 304.

Figure 12:
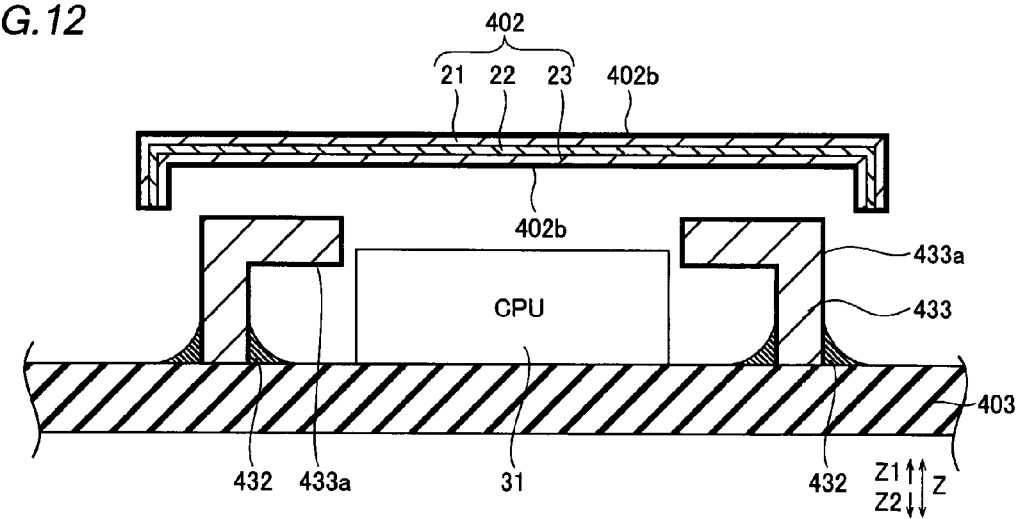
[FIG. 12] A sectional view showing a chassis and a substrate according to a second modification of the embodiment of the present invention.

As shown in FIG. 12, a Sn-based plating layer 402*b* is preferably formed on a surface of the chassis 402. Furthermore, a Sn-based plating layer 433*a* is preferably formed on a surface of the supporting portion 433. The chassis 402 can be mechanically mounted on the supporting portion 433 by screws or caulking, but soldering is frequently employed in the field of an electronic component or the like. In the case where a chassis having no Sn-based plating layer is soldered to the supporting portion or the like, Sn contained in the solder may be abnormally grown (whisker). Therefore, the Sn-based plating layer 402*b* is preferably formed on at least a portion of the chassis 402 involved in soldering. This Sn-based plating layer 402*b* may be formed on a surface of the clad material before the clad material is formed into the chassis 402 or may be formed on the surface of the chassis 402 after the clad material is formed into the chassis 402. In view of productivity, tools required for plating formation, etc., the Sn-based plating layer 402*b* is preferably formed on substantially entire front and rear surfaces (both sides) of the chassis 402 made of austenite stainless steel. For Sn-based plating, Sn or a Sn alloy is applicable, and Sn whose purity is at least 99% is more preferable. The Sn-based plating layer 402b is an example of the "surface metal layer" in the present invention.

Figure 13:
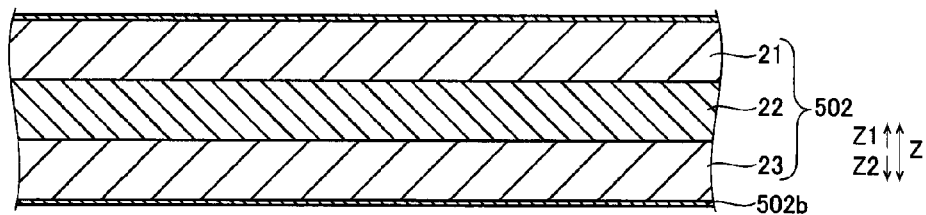
[FIG. 13] A sectional view showing a chassis and a substrate according to a third modification of the embodiment of the present invention.

While the example of making the chassis 2 of the three-layered clad material has been shown in the aforementioned embodiment, the present invention is not restricted to this. According to the present invention, a Ni layer 502b may be formed over a substantially entire surface of a chassis 502 as in a third modification of the aforementioned embodiment shown in FIG. 13. This Ni layer 502b may be formed by plating or may be formed integrally with the chassis 502 as a clad material by roll-bonding a Ni layer, a first layer, a second layer, a third layer, and a Ni layer in a state where the same are stacked in this order. Thus, an increase in electric resistance (contact resistance) in a contact portion between the chassis 502 and an electric circuit can be suppressed, and hence the chassis 2 can be also employed as a current circuit for earthing the electric circuit. The Ni layer 502b is only required to be formed at a position of the surface of the chassis 502 coming into contact with at least an electronic component of a portable device. The corrosion resistance of the chassis 502 can be also improved by the Ni layer 502b. As a metal material of which the Ni layer 502b is made, Ni or a Ni alloy such as a Ni—P alloy is applicable. The Ni layer 502b is an example of the "surface metal layer" in the present invention.

While the example of providing the chassis 2 in the portable device 100 including the display 1 has been shown in the aforementioned embodiment, the present invention is not restricted to this. For example, the chassis may be provided in a portable router or the like having no display. In this case, the chassis can efficiently radiate heat from a battery of the router and the CPU. Alternatively, the chassis may be employed in a small stationary device.

While the example of employing the display 1 and the CPU 31 as the electronic components easily generating heat has been shown in the aforementioned embodiment and the example of employing the display 1, the CPU 31, and the battery 304 as the electronic components easily generating heat has been shown in the aforementioned modification, the present invention is not restricted to this. According to the present invention, an electronic component such as a power circuit, for example, may be employed as the electronic component easily generating heat.

While the example of setting the thickness t1 of the chassis 2 to 0.3 mm has been shown in the aforementioned embodiment, the present invention is not restricted to this.

While the example of employing the single chassis 2 made of the three-layered clad material has been shown in the aforementioned embodiment, the present invention is not restricted to this. According to the present invention, the chassis according to the present invention can be configured employing a plurality of chassis members each made of a three-layered clad material.

While the example of making both the SUS layer 21 (first layer) and the SUS layer 23 (third layer) of SUS 304 or SUS 301 has been shown in the aforementioned embodiment, the present invention is not restricted to this. According to the present invention, the first layer and the third layer may be made of austenite stainless steel other than SUS 304 and SUS 301. For example, both the first layer and the third layer can be made of SUS 316 having a larger amount of Ni than SUS 304 to enhance a suppressing effect on magnetizing of the first layer and the third layer. Alternatively, the first layer and the third layer may be made of different austenite stainless steel. For example, several combinations such as a combination of SUS 304 and SUS 301 and a combination of SUS 316 and SUS 304 can be considered according to use conditions or the like.

While the example of making the Cu layer 22 of Cu whose purity is at least 99.9% has been shown in the aforementioned embodiment, the present invention is not restricted to this. According to the present invention, the Cu layer may be made of a Cu alloy in which the purity of Cu is at least 97%, such as C19400 (CDA standards) of Cu-2.30Fe-0.10Zn-0.03P. This Cu alloy has higher mechanical strength than the aforementioned Cu, and hence the mechanical strength of the chassis can be further improved.

While the example of forming nothing on the upper surface of the chassis 2 has been shown in the aforementioned embodiment, the present invention is not restricted to this. According to the present invention, a Cu foil layer may be formed on the upper surface of the chassis according to the present invention as in Comparative Example 6 shown in FIG. 5, or a heat conductive adhesive sheet for bonding the display may be arranged on the upper surface of the chassis according to the present invention. The commercial usefulness of the chassis having this structure can be most likely further enhanced as a thin chassis having excellent heat radiation performance.

While the example of bringing the upper surface of the CPU 31 on the Z1 side into contact with the lower surface of the chassis 2 on the Z2 side has been shown in the aforementioned embodiment, the present invention is not restricted to this. According to the present invention, the CPU and the chassis may be bonded to each other through an adhesive, or the CPU and the chassis may be arranged through another member.

REFERENCE NUMERALS

1: display (electronic component)
2, 402: chassis
21: SUS layer (first layer)
22: Cu layer (second layer)
23: SUS layer (third layer)
31: CPU (electronic component)
100, 300: portable device
304: battery (electronic component)
402b: Sn-based plating layer (surface metal layer)
502b: Ni layer (surface metal layer)

The invention claimed is:

1. A chassis made of a clad material in which a first layer made of austenite stainless steel, a second layer made of Cu or a Cu alloy, stacked on the first layer, and a third layer made of austenite stainless steel, stacked on a side of the second layer opposite to the first layer are roll-bonded to each other, wherein
   a thickness of the second layer is at least 15% and not more than 60% of a thickness of the clad material, and
   the chassis is employed as the chassis of a device containing an electronic component radiating heat.

2. The chassis according to claim 1, wherein
   the thickness of the second layer is at least 20% of the thickness of the clad material.

3. The chassis according to claim 2, wherein
   the thickness of the second layer is at least 30% of the thickness of the clad material.

4. The chassis according to claim 1, wherein
   the thickness of the second layer is not more than 50% of the thickness of the clad material.

5. The chassis according to claim 1, wherein
the first layer and the third layer are made of austenite stainless steel, and an average value of a thickness of the third layer is at least 95% and not more than 105% of an average value of a thickness of the first layer.

6. The chassis according to claim 1, wherein
the thickness of the clad material is not more than 0.3 mm.

7. The chassis according to claim 1, wherein
the first layer and the third layer are made of austenite stainless steel, and the second layer is made of Cu.

8. The chassis according to claim 7, wherein
the first layer and the third layer are made of SUS 304.

9. The chassis according to claim 7, wherein
the first layer and the third layer are made of SUS 301.

10. The chassis according to claim 1, employed as the chassis of a portable device intrinsically containing an electronic component radiating heat.

11. The chassis according to claim 10, with which the electronic component radiating heat is in contact.

12. The chassis according to claim 1, having a surface metal layer on at least a part of the chassis.

13. The chassis according to claim 12, having the surface metal layer on a substantially entire surface of the chassis.

14. The chassis according to claim 12, having the surface metal layer formed by plating on at least the part of the chassis.

15. The chassis according to claim 12, having the surface metal layer formed by roll-bonding on at least the part of the chassis.

16. The chassis according to claim 12, wherein
the surface metal layer is made of Sn or a Sn alloy.

17. The chassis according to claim 12, wherein
the surface metal layer is made of Ni or a Ni alloy.

18. A method for manufacturing a chassis, comprising:
roll-bonding a first layer made of austenite stainless steel, a second layer made of Cu or a Cu alloy, and a third layer made of austenite stainless steel to each other in a state where the first layer, the second layer, and the third layer are stacked in this order to form a clad material such that a thickness of the second layer is at least 15% and not more than 60% of a thickness of the clad material, and
diffusion-annealing the clad material,
wherein the chassis is employed as the chassis of a device containing an electronic component radiating heat.

19. The method for manufacturing a chassis according to claim 18, wherein
the step of roll-bonding the first layer, the second layer, and the third layer in the stacked state and the step of diffusion-annealing the clad material are alternately performed a plurality of times.

* * * * *